United States Patent [19]

Geyer et al.

[11] Patent Number: 4,795,077

[45] Date of Patent: Jan. 3, 1989

[54] BONDING METHOD AND APPARATUS

[75] Inventors: Harry J. Geyer, Phoenix; James H. Knapp, Gilbert; Setsuko J. Cole, Phoenix, all of Ariz.

[73] Assignee: Motorola Inc., Schaumburg, Ill.

[21] Appl. No.: 197,137

[22] Filed: May 23, 1988

[51] Int. Cl.⁴ .............................................. B23K 31/00
[52] U.S. Cl. ...................................... 228/106; 228/5.5; 228/180.2; 228/239
[58] Field of Search ............ 228/238, 239, 5.5, 180.2, 228/106; 29/827, 739, 741; 219/56.22

[56]  References Cited
U.S. PATENT DOCUMENTS

| | | |
|---|---|---|
| 3,457,814 | 7/1969 | Muchnich . |
| 3,771,212 | 11/1973 | Jackson et al. . |
| 3,869,260 | 3/1975 | Jackson et al. . |
| 3,941,292 | 3/1976 | Osipov et al. . |
| 3,941,297 | 3/1976 | Burns et al. .................. 228/180.2 |
| 4,166,562 | 9/1979 | Keizer et al. . |
| 4,300,715 | 11/1981 | Keizer et al. . |
| 4,536,786 | 8/1985 | Hayakawa et al. ............. 228/180.2 |
| 4,585,157 | 4/1986 | Belcher . |
| 4,607,779 | 8/1986 | Burns ............................. 228/180.2 |
| 4,657,170 | 8/1987 | Miller . |

Primary Examiner—Nicholas P. Godici
Assistant Examiner—Karen Skillman
Attorney, Agent, or Firm—Joe E. Barbee; Raymond J. Warren

[57] ABSTRACT

A method for bonding which comprises the step of heating a bottom thermode to a temperature of approximately 150° C. The bottom thermode is then pulse heated to approximately 350° C. while a die and lead frame are disposed above the lower thermode. An upper thermode, which may remain unheated, is then lowered to cause contact between the lead frame and the contacts of the die. The lower thermode then returns to a temperature of approximately 150° C. The pulse heating of the lower thermode lasts for approximately 1-3 seconds.

13 Claims, 2 Drawing Sheets

BONDING METHOD AND APPARATUS

BACKGROUND OF THE INVENTION

This invention relates, in general, to a bonding method and apparatus and, more particularly, to a bonding method and apparatus for use in bonding leads to a semiconductor die.

Various types of bonding apparatus are known in the art. In general, these apparatus have a bottom thermode forming a base on which the die and lead frame rest. This bottom thermode is generally heated to a nominal temperature between approximately 150° C. and 250° C. A top thermode is then heated above the melting point of the materials to be bonded. For bonding a tin plated copper lead to a gold contact, the upper thermode is heated to 475-550° C. The upper thermode is then lowered causing the leads to rest on the contacts. A temperature of 300-350° C. is required for the bond to form between the tin plated copper lead and the gold bump. However, because of the efficiency of the die and lead frame to conduct heat, the thermode must be heated to 475-550° C. The heat transfer from the gold bump to the substrate has been shown to result in microcracking of the silicon. This can cause problems in subsequent processing of the devices where the bump may be pulled out of the silicon.

Another problem in the prior art is that the upper thermode blade has a planar edge. Because of variances in die thickness across a single die, or between the thermode and the heater block, the gold bumps may be in a plane different from that of the upper thermode blade. This results in either exerting too much pressure on the higher bumps or not bonding the leads to the lower bumps.

Accordingly, it is an object of the present invention to provide a bonding method and apparatus which overcomes the above deficiencies.

Another object of the present invention is to form a bond between the lead frame and the die which will not damage the substrate.

Still another object of the present invention is to provide a bonding apparatus which is compliant and will adapt to variances in bump planarity.

The above and other objects and advantages of the present invention are provided by the bonding method and apparatus described herein.

SUMMARY OF THE INVENTION

A particular embodiment of the present invention consists of a method of bonding which comprises the step of heating the bottom thermode to approximately 150° C. The bottom thermode is then pulse heated to approximately 350° C. while the die and leadframe are in place. The upper thermode, which may remain unheated or heated between 150° C. and 250° C., then contacts the lead frame pressing against the die contacts.

Another particular embodiment of the present invention consists of an apparatus having a top thermode blade coupled to a compliant shaft. This allows the thermode blade to adjust for variances in the planarity of the contact bumps.

DETAILED DESCRIPTION OF THE FIGURES

Figure 1:
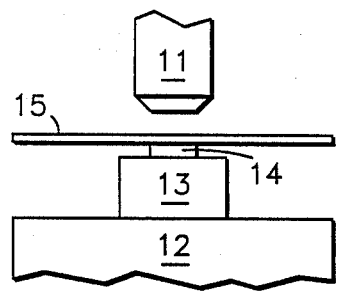
FIGS. 1 and 2 are partial side views of a prior art bonding apparatus.
Figure 2:
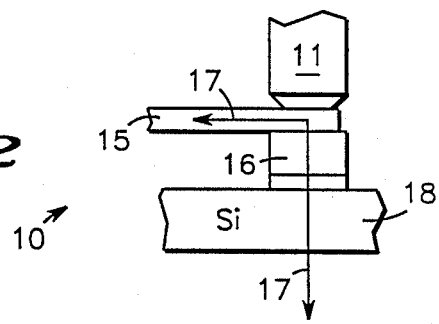

Referring initially to FIGS. 1 and 2, partial side views of a bonding apparatus, generally designated 10, are illustrated. Apparatus 10 consists generally of top thermode 11, a pedestal 12, and a bottom thermode 13. A die 14 and lead frame 15 are disposed on bottom thermode 13 for bonding. The prior art method of bonding required bottom thermode 13 to be heated to approximately 150° C. This heats die 14 and lead frame 15 to approximately 150° C. Upper thermode 11 is heated to 475-550° C.

Upper thermode 11 is then lowered to contact lead 15 and push this onto a bump 16 which is disposed on a substrate 18. The heat from upper thermode 11 is transferred through lead 15 and bump 16, substrate 18, and out through lower thermode 13. This is represented by arrow 17.

Because of the heat dissipation, thermode 11 must be heated to 475-550° C. to provide a temperature of 300-350° C. at the interface of lead 15 and bump 16. This is the heat necessary to reach the gold-tin eutectic melting point and form the bond. This high level of heat being transmitted through bump 16 to substrate 18 causes damage at the interface due to mismatch and thermal expansion as well as other factors. The result is that the silicon bonded to tab bump 16 can break away leaving a crater in the substrate.

Figure 3:
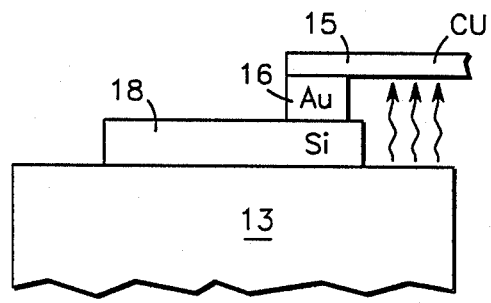
FIG. 3 is a partial view of a bottom thermode embodying the present invention.
Figure 4:
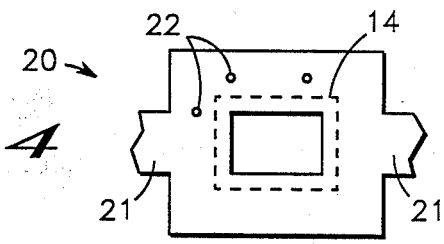
FIGS. 4 and 5 are top views of bottom thermode blades for use with the thermode of FIG. 3.

In an attempt to resolve the problem, a method of heating the bottom thermode to 350° C. rather than 150° C. was attempted. This resulted in more problems in high density lead count devices In these devices, the leads are numerous and very fine. Therefore, the leads are held in place by a polyimide. By heating lower thermode 13 to 350° C., heat is radiated to lead frame 15 which can melt the polyimide. This is illustrated in FIG. 3. Melting the polyimide allows the leads to float, or move, particularly when contacted by upper thermode 11.

The next step in reaching the present invention was to pulse the lower thermode from 150° C. to 350° C. for a short period of time, 0.5-3.0 seconds. This provides heat through substrate 18 and tab bump 16 to lead 15. The duration of the pulse is short enough that the polyimide will not be affected, but is long enough to provide the heat level necessary to reach the melting point of the gold-tin eutectic. In order to refine this process to provide uniform heat, a bottom thermode blade 20 was developed. Blade 20 has contacts 21 at opposite sides thereof. A set of pins 22 is provided on blade 20 for alignment of die 14. In use, it was found that blade 20 did not heat evenly about its circumference, particularly at the corners.

Figure 5:
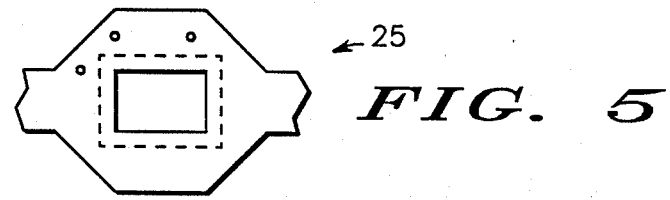

This was the result of the cross section of blade 20 at the corners being greater than at the sides. To resolve this problem, a second blade 25, FIG. 5, was designed.

Blade 25 seeks to maintain a uniform cross sectional area about the circumference of the blade. This provides a constant heat about the circumference of blade 25.

Figure 7:
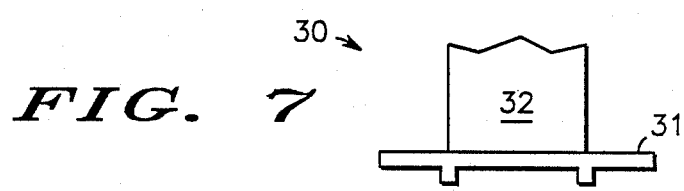
FIG. 7 is a top compliant thermode embodying the present invention.

In the process of heating the device to be bonded with lower thermode 13, the need for heating with top thermode 11 was eliminated. Therefore, a compliant thermode 30, FIG. 7, was developed. Thermode 30 consists of a blade 31 coupled to a compliant shaft 32. Compliant shaft 32 is made of rubber, polyimide, or the like.

Figure 6:
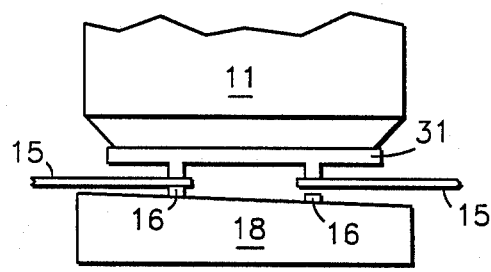
FIG. 6 is a side view of a prior art top thermode blade in use.

This compliant thermode resolves the problem of the contact bumps being in a planar relation different from the plane in which the thermode blade is disposed. As shown in FIG. 6, a prior art thermode 11 is bonding leads 15 to tab bumps 16. In FIG. 6, tab bumps 16 are in a plane slightly different from the plane of blade 31. This can result in one of two problems. First, a portion of leads 15 will not contact tab bumps 16, leaving electrical opens. Second, if thermode 11 is forced down to complete the contact of leads 15 to tab bumps 16, bumps 16 that are contacted first can be damaged. This can also damage substrate 18.

Figure 8:
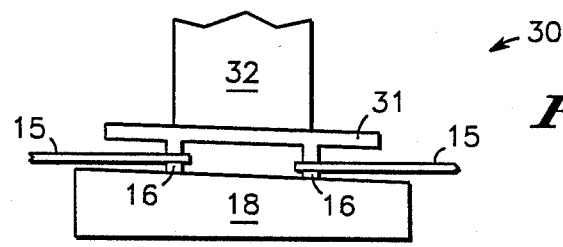
FIG. 8 is a side view of the top thermode of FIG. 7 in use.

As shown in FIG. 8, a compliant thermode 30 will adjust to compensate for variances in the height of tab bumps 16. Compliant thermode 30 will provide contact of all leads 15 to their associated bumps 16 without applying excess pressure to bumps 16 or substrate 18.

Figure 9:
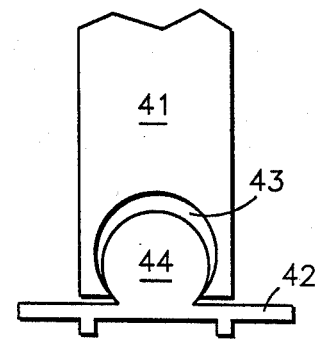
FIG. 9 is a second embodiment o a top compliant thermode of the present invention.

Referring now to FIG. 9, a second embodiment of a top compliant thermode, generally designated 40, is illustrated. Thermode 40 consists of a shaft 41 having a socket 43 defined therein. Shaft 40 would preferably be composed of an insulator type material which would allow a blade 42 to be heated. This heating can be either constant heat or a pulsed heat as used in the lower thermode. Blade 42 comprises a ball 44 which mates with socket 43. Blade 43 is permitted to float so that it will match the surface of bumps 16 being bonded.

It should be noted here that while the present description has referred to bonding gold bumps to a tin plated copper lead frame, this system will function with thermal compression bonding of other materials.

Thus, it will be apparent to one skilled in the art that there has been provided in accordance with the invention, a device that fully satisfies the objects, aims, and advantages set forth below.

While the invention has been described in conjunction with specific embodiments thereof, it is evident that any alterations, modifications, and variations will be apparent to those skilled in the art in light of the foregoing description. Accordingly, it is intended to embrace all such alterations, modifications, and variations in the appended claims.

We claim:

1. A method of bonding a lead frame to contacts of a semiconductor die comprising;
   depositing a first surface of said semiconductor die on a blade of a lower thermode;
   aligning a lead frame over a second surface of said semiconductor die, said second surface being opposite said first surface and containing said contacts of said semiconductor die;
   ramping the temperature of said blade of said lower thermode from approximately 150° C. to approximately 350° C.;
   lowering an upper thermode onto said lead frame;
   contacting said lead frame to said contacts of said semiconductor die; and
   ramping the temperature of said blade of said lower thermode from approximately 350° C. to approximately 150° C.

2. The method of claim 1 further comprising the step of heating a blade of said upper thermode to approximately 350° C.

3. The method of claim 1 wherein said upper thermode comprises:
   a compliant shaft; and
   a blade coupled to said compliant shaft.

4. The method of claim 3 wherein said compliance shaft comprises a polyimide.

5. The method of claim 1 wherein said upper thermode comprises:
   a shaft defining a socket opening therein;
   a blade; and
   a ball coupled to said blade and disposed in a mating relation to the socket opening of said shaft.

6. The method of claim 1 wherein said blade of said lower thermode comprises:
   a plurality of sides each having a first cross sectional area; and
   a plurality of corners each having a second cross sectional area, wherein said second cross sectional area and said first cross sectional area are approximately equal.

7. A method of bonding a lead frame to contacts of a semiconductor die comprising:
   depositing a first surface of said semiconductor die on a blade of a lower thermode;
   aligning a lead frame over a second surface of said semiconductor die, said second surface being opposite said first surface and containing said contacts of said semiconductor die;
   ramping the temperature of said blade of said lower thermode from approximately 150° to approximately 350° C.;
   lowering an upper thermode heated to approximately 350° C. onto said leadframes;
   contacting said lead frame to said contacts of said semiconductor die;
   ramping the temperature of said blade of said lower thermode from approximately 350° C. to approximately 150° C.

8. The method of claim 7 wherein said upper thermode comprises:
   a compliant shaft; and
   a blade coupled to said compliant shaft.

9. The method of claim 8 wherein said compliant shaft comprises a polyimide.

10. The method of claim 7 wherein said upper thermode comprises:
    a shaft defining a socket opening therein;
    a blade; and
    a ball coupled to said blade and disposed in a mating relation to the socket opening of said shaft.

11. The method of claim 7 wherein said blade of said lower thermode comprises:
    a plurality of sides each having a first cross sectional area; and
    a plurality of corners each having a second cross sectional area, wherein said second cross sectional area and said first cross sectional area are approximately equal.

12. A method of bonding a lead frame to contacts of a semiconductor die comprising:

depositing a first surface of said semiconductor die on a blade of a lower thermode, wherein said blade comprises:
  a plurality of sides each having a first cross sectional area; and
  a plurality of corners each having a second cross sectional area, wherein said second cross sectional area and said first cross sectional area are approximately equal;
aligning said lead frame over a second surface of said semiconductor die, said second surface being opposite said first surface and containing said contacts of said semiconductor die;

ramping the temperature of said blade of said lower thermode from approximately 150° C. to approximately 350° C.;
lowering an upper thermode heated to 350° C. and comprising a compliant shaft, and a blade coupled to said compliant shaft onto said lead frames;
contacting said lead frame to said contacts of said semiconductor die; and
ramping the temperature of said blade of said lower thermode from approximately 350° C. to approximately 150° C.

13. The method of claim 12 wherein said compliant shaft comprises a polyimide.

* * * * *